United States Patent [19]

Scholz

[11] Patent Number: 5,093,987
[45] Date of Patent: Mar. 10, 1992

[54] METHOD OF ASSEMBLING A CONNECTOR TO A CIRCUIT ELEMENT AND SOLDERING COMPONENT FOR USE THEREIN

[75] Inventor: James P. Scholz, Mechanicsburg, Pa.

[73] Assignee: AMP Incorporated, Harrisburg, Pa.

[21] Appl. No.: 631,814

[22] Filed: Dec. 21, 1990

[51] Int. Cl.⁵ .............................................. H01R 43/02
[52] U.S. Cl. ........................................ 29/860; 228/57; 228/159; 228/180.2
[58] Field of Search ..................... 29/860; 228/57, 159, 228/180.2

[56] References Cited

U.S. PATENT DOCUMENTS

| | | | |
|---|---|---|---|
| 4,256,945 | 3/1981 | Carter et al. | 219/10.75 |
| 4,623,401 | 11/1986 | Derbyshire et al. | 148/13 |
| 4,626,767 | 12/1986 | Clappier et al. | 323/280 |
| 4,659,912 | 4/1987 | Derbyshire | 219/535 |
| 4,695,713 | 9/1987 | Krumme | 219/553 |
| 4,701,587 | 10/1987 | Carter | 219/10.75 |
| 4,717,814 | 1/1988 | Krumme | 219/553 |
| 4,745,264 | 5/1988 | Carter | 219/553 |
| 4,789,767 | 12/1988 | Doljack | 219/9.5 |
| 4,852,252 | 8/1989 | Ayer | 29/860 |
| 4,903,402 | 2/1990 | Norton et al. | 29/843 |
| 4,925,400 | 5/1990 | Blair et al. | 439/374 |
| 4,987,283 | 1/1991 | Beinhaur et al. | 219/85.11 |
| 4,995,838 | 2/1991 | Ayer et al. | 439/874 |

FOREIGN PATENT DOCUMENTS

0241597 10/1987 European Pat. Off. .

Primary Examiner—P. W. Echols
Attorney, Agent, or Firm—Anton P. Ness

[57] ABSTRACT

A connector (10) having one or more arrays of elongate arms (22) of contacts (20) having contact sections (26) on free ends (24) thereof to be soldered to respective traces (94) of a circuit element (90), facilitated by securing a soldering component (40) to free ends (24). Component (40) includes a block member (42) along the outer surface of which is secured a lead frame (60) which includes a corresponding plurality of fingers (66) extending transversely from an elongate body section (62). Block (42) is of thermally insulative material having solder resistive surfaces. On the finger ends (68) are affixed preforms (88) of solder; on body section (62) is defined a thin magnetic layer, transforming the brass carrier strip into a Curie point heater. When the body section is subjected to RF current, it generates thermal energy which melts the solder preforms to join the fingers first to the contact sections (26) of the connector contacts (20), and at a remote site later subjected to RF current to reflow the solder preform (88) to join contact sections (26) to traces (94). Block (42) is then removed along the body section (62) and portions of figures (66), defining discrete electrical connections at the solder joints.

9 Claims, 7 Drawing Sheets

METHOD OF ASSEMBLING A CONNECTOR TO A CIRCUIT ELEMENT AND SOLDERING COMPONENT FOR USE THEREIN

FIELD OF THE INVENTION

The present invention relates to the field of electrical connectors, and more particularly to connectors for electrical connection to circuit elements such as printed circuit boards and the like.

BACKGROUND OF THE INVENTION

Electrical connectors are known which include a plurality of electrical contacts having exposed contact sections for electrical connection to circuits of a circuit element, such as conductive traces disposed on a major surface of a printed circuit board. U S. Pat. Nos. 4,903,402 and 4,925,400 disclose similar such connectors which include two arrays of contacts each associated with respective arrays of conductive traces of printed circuit elements secured to opposed sides of a common central cooling plate of a module such as a line replaceable module (LRM), the connector being secured by fasteners to the cooling plate at an end thereof; the plate, the circuit cards and board-mounted components thereon, and the connector are disposed within protective covers of the module, with the connector having a mating face exposed at the end of the module for mating to another connector.

Arrays of such modules are commonly used in electronics units such as black boxes aboard aircraft, each matable with connectors on a mother board within the unit or box. The contacts are conventionally connected to the conductive traces of the circuit cards by their contact sections being soldered thereto in a surface mount arrangement; the contact sections are defined proximate free ends of elongate cantilever arms. The connector is mounted within the module in such a manner as to be incrementally movable transversely with respect to the module covers and the circuit cards affixed to the cooling plate, upon mating when the module is inserted into the electronics unit or black box; the elongate cantilever arms are flexible, and the incremental movement does not disturb nor overstress the soldered connections of the contacts to the conductive traces of the circuit cards.

U.S. Pat. No. 4,903,402 also discloses a method of assembling the connector to the circuit cards previously affixed to the cooling plate, and a method of fabricating the connector to facilitate such assembly. The plurality of contacts of a row are stamped and formed while on a continuous carrier strip, as is conventional and the contact sections are precisely spaced apart a selected distance. The carrier strip is joined to the contacts of a row at the free ends of the elongate cantilever arms beyond the contact sections, which are formed into convex shapes enhancing fillet formation of the solder joints. Several rows of contacts associated with a single printed circuit element are to have their contact sections in a common plane to be joined to respective traces on a common surface of the circuit card; the carrier strips of the several rows are joined integrally together after the spaced contact sections of each row are registered with respect to those of the other rows to attain the desired spacing matching that of the trace array to which they will be soldered; the multirow array of contacts of the connector are handled as a unit during connector fabrication. The joined carrier strips are maintained on the arm free ends until after soldering is complete, whereafter the joined strips are carefully broken away in a manner not disturbing the solder joints. The method disclosed maintains the contacts precisely spaced apart to match the close spacing of the traces (such as 0.025 inches between trace centerlines), and minimizes tendencies of the elongate cantilever arms to be bent or broken or their spacing disturbed during handling prior to soldering, and thus eliminates the need for alignment tooling at the soldering operation of the type necessary to realign and again precisely space the contact sections of the individual arms to match the respective closely spaced traces.

In U.S. Pat. No. 4,852,252 electrical contact terminals are disclosed to be soldered to discrete wires after the terminals have been disposed within a dielectric housing, and the terminations sealed from the environment. The solder tail contact section of each terminal extends rearwardly from the housing rearward face; a length of heat recoverable dielectric tubing containing an annular preform of solder centrally along its length placed over the solder tail; the stripped end of the conductor wire is superposed over the solder tail within the tubing, and the solder preform is positioned around the superposed solder tail/wire end. The solder is then melted and flows around the solder tail and wire end, forming a solder joint electrically joining the wire and the terminal; the heat recoverable tubing shrinks in diameter until adjacent the portion of the conductor wire and the terminal within the tubing, and sealant material at ends of the tubing melts and seals the ends of the tubing to the wire insulation and dielectric material of housing flanges extending along a portion of each terminal exiting the housing sealing the termination and exposed metal from the environment.

U.S. Pat. No. 4,852,252 further discloses providing the terminals each with a thin layer of magnetic material along the surface of the nonmagnetic low resistance solder tail of the terminal facing away from the surface to which the wire end will be soldered; in U.S. patent application Ser. No. 07/385,643 filed Jul. 27, 1989, now U.S. Pat. No. 4,995,838 a preform of foil having a magnetic layer is disclosed to be soldered to the terminal solder tail's wire-remote surface. The bimetallic structure uses the Curie temperature of the magnetic material to define an article which will generate thermal energy when subjected to radiofrequency current of certain frequency for sufficient short length of time until a certain known temperature is achieved, above which the structure is inherently incapable of rising; by selecting the magnetic material and sufficient thickness thereof and selecting an appropriate solder, the temperature achieved can be selected to be higher than the reflow temperature of the solder preform; when the terminal is subjected through induction to RF current of the appropriate frequency, the solder tail will generate heat which will radiate to the solder preform, reflow the solder, and be conducted along the wire and the terminal and radiate further to shrink the tubing and melt the sealant material. The terminal thus includes an integral mechanism for enabling simultaneous soldering and sealing without other application of heat; excess heat is avoided as is the potential of heat damage to remaining portions of the connector or tubing.

Another U.S. Pat. No. 4,789,767 discloses a multipin connector whose contacts have magnetic material layers on portions thereof spaced from the contact sections to be surface mounted to respective traces on the surface of a printed circuit board. An apparatus is disclosed having a coil wound magnetic core having multiple shaped pole pieces in spaced pairs with an air gap therebetween within which the connector is placed during soldering. The pole pieces concentrate flux in the magnetic contact coating upon being placed beside the contact sections to be soldered, to transmit RF current to each of the contacts, generating thermal energy to a known maximum temperature to reflow the solder and join the contact sections to the conductive traces of the printed circuit element.

Such Curie point heating is disclosed in U.S. Pat. Nos. 4,256,945; 4,623,401; 4,659,912; 4,695,713; 4,701,587; 4,717,814; 4,745,264 and European Patent Publication No. 0241,597. When a radio frequency current for example is passed through such a bipartite structure, the current initially is concentrated in the thin high resistance magnetic material layer which causes heating; when the temperature in the magnetic material layer reaches its Curie temperature, it is known that the magnetic permeability of the layer decreases dramatically; the current density profile then expands into the non-magnetic substrate of low resistivity. The thermal energy is then transmitted by conduction to adjacent structure such as wires and solder which act as thermal sinks; since the temperature at thermal sink locations does not rise to the magnetic material's Curie temperature as quickly as at non-sink locations, the current remains concentrated in those portions of the magnetic material layer adjacent the thermal sink locations and is distributed in the low resistance substrate at non-sink locations. It is known that for a given frequency the self-regulating temperature source thus defined achieves and maintains a certain maximum temperature dependent on the particular magnetic material. One source for generating radiofrequency current such as of 13.56 mHz is disclosed in U S. Pat. No. 4,626,767.

The conductive substrate can be copper having a magnetic permeability of about one and a resistivity of about 1.72 micro-ohm-centimeters. The magnetic material may be for example a clad coating of nickel-iron alloy such as Alloy No. 42 (42% nickel, 58% iron) or Alloy No. 42-6 (42% nickel, 52% iron and 6% chromium). Typical magnetic permeabilities for the magnetic layer range from fifty to about one thousand, and electrical resistivities normally range from twenty to ninety micro-ohm-centimeters as compared to 1.72 for copper; the magnetic material layer can have a Curie temperature selected to be from the range of between about 200° C. to about 500° C., for example. The thickness of the magnetic material layer is typically one to three skin depths; the skin depth is proportional to the square root of the resistivity of the magnetic material, and is inversely proportional to the square root of the product of the magnetic permeability of the magnetic material and the frequency of the alternating current passing through the two-layer structure. Solders can be tin-lead such as for example Sn 63 reflowable at a temperature of about 183° C. or Sb-5 reflowable at a temperature of about 240° C. Generally it would be desirable to select a Curie temperature of about 50° C. to 75° C. above the solder reflow temperature.

It is desirable to simplify the process of soldering contact sections to circuit traces.

It is also desirable to eliminate the need at soldering to realign the individual ones of the plurality of contact sections at ends of elongate cantilever beam arms, and the combing tooling necessary to such individual arm realignment.

It is especially desirable to perform soldering in a process not subjecting all portions of the printed circuit element and the connector to the high temperatures requisite to reflow solder.

It is further desirable to simplify the providing of solder at discrete solder joint sites for such soldering.

SUMMARY OF THE INVENTION

The present invention is a method of soldering an array of contact sections of a plurality of contacts of a multicontact connector to a corresponding array of respective traces on the surface of a printed circuit element such as a VHSIC card or the like, without the need to precisely respace or realign each elongate cantilever beam arm of one or more rows of contacts of the connector with the respective traces utilizing expensive comb tooling in a time-consuming process, in order to perform soldering at a site remote from the site of manufacture of the connector. The connector is first fabricated with at least one array of one or more rows of contacts on each side, each array associated with a common trace-containing surface of a printed circuit element such that first contact sections of the terminals of each array are proximate free ends of the cantilever beam arms of the contacts and are disposed in a common plane even if the body sections of the contacts are arranged in a plurality of rows within the housing of the connector so that second contact sections at the other ends are arranged in a multirow array for mating with a mating connector. The first contact sections are disposed side-by-side at equally spaced intervals corresponding to the traces of the printed circuit element to which they are to be soldered.

In accordance with the present invention, a soldering component is secured to the first contact sections of the array, the component including a block of thermally insulative solder resistive material extending along the array, to which a conductive lead frame is secured along the outer surface of the block. The lead frame is fabricated having a plurality of thin, narrow fingers coextending transversely from an elongate common body section, and the fingers are spaced to be associated with a respective one of the first contact sections of the connector contact array, with the fingers disposed in respective grooves of the block.

The elongate body section and fingers of the lead frame are stamped from a strip of low resistance, low magnetic permeability metal such as beryllium copper; along the body section a second layer is defined superposed on a major surface thereof, the body section comprising the first layer, the second layer being of a metal which has high magnetic permeability and high resistance such as a nickel-iron alloy having a thickness of about 0.0005 inches or about one-and-one-half to two times the thickness of a "skin depth" of the particular metal. With the first contact sections being for example about 0.010 inches wide, the fingers would be as wide. The thickness of each finger preferably is reduced by skiving to define a recess within each of which is deposited a respective inlay or preform of solder facing outwardly from the block surface as the finger is disposed along and against the bottom of a respective groove of the block. The body section is secured to the outer surface of the block so that the second layer is preferably facing outwardly.

The soldering component is then joined to the free ends of the elongate cantilever beam arms of each contact of each array, with the fingers superposed to coextend along the first contact sections thereof, on the trace-remote surface, after which flux is preferably added. Through the use of comb tooling (during connector fabrication), the elongate cantilever beam arms are maintained precisely spaced from each other and the first contact sections held coplanar; the soldering block is then carefully urged against the contact arm array so that the contact arm free ends are received into the grooves of the block and the fingers of the lead frame within the grooves are maintained against the trace-remote surfaces of the first contact sections; tooling of an apparatus for generating alternating high frequency, constant amplitude current of for example 13.56 mHz is positioned at least proximate, and may be held against, the magnetic layer of the body section of the lead frame and activated for a small length of time such as for example three to five seconds. Thermal energy is generated by the bimetallic body section to a temperature higher than the melting point of the solder preform for a very brief time sufficient to reflow the solder preforms and join the fingers to the contact sections; the solder adjacent the contact section then cools to form a solder joint to the contact section. Soldering components may joined to both arrays of first contact sections sequentially or simultaneously.

The connector with a soldering component joined to each of the arrays of elongate cantilever beam arms thereof then comprises an assembly ready to be soldered to a circuit element, such as VHSIC cards secured to both sides of a central cooling plate, or perhaps to both surfaces of a single two-sided printed circuit board. The circuit element is inserted between the lead frames of both arrays and against the trace-proximate surfaces of the first contact sections of the connector, and registration attained of the traces with the first contact sections. The presoldering steps are performable without the need to reassure alignment and spacing of the individual first contact sections since the soldering components maintain the spacing and alignment during handling and shipping of the connector assembly prior to soldering which may easily now be performed remote from the site of connector manufacture without expensive contact arm realignment and respacing and special alignment tooling therefor.

The contact sections are pressed against the respective traces to assure engagement therewith during soldering; flux is again added at the solder sites; the bimetallic body section is again engaged by RF-transmitting tooling of an RF generating apparatus; and the lead frames again generate thermal energy sufficient to reflow solder. The solder now flows around the edges of the contact arm free ends and wicks into the regions between the convex arcuate first contact section and the respective trace; solder joints are now formed joining the first contact sections to the conductive traces of the printed circuit elements. The soldering component is now carefully manipulated by limited pivoting about the end of the free ends of the contact arm array, for the fingers extending therefrom to be broken near the contact arm free ends and the solder component and the body section removed from the now-soldered assembly, electrically isolating all the joints of first contact sections and circuit traces and defining discrete electrical connections of the connector contacts with the circuit element traces.

With the present invention, no manual soldering is thus necessary nor another conventional soldering process, such as a vapor phase reflow process, wherein the entire printed circuit element would be have to be subjected to high temperatures of the levels necessary to reflow solder in order to mount the connector contacts to the traces. With heat generated very quickly at only the solder sites for only a very brief time period, little heat remains to have deleterious effects. Delamination of conventional printed circuit boards as is common with hand soldering especially, is thus avoided. The present invention thus enables electronic components such as integrated circuit chips and even optical devices such as LEDs and detectors and their associated terminated fiber optic cables to be mounted such as by soldering to the circuit element, prior to mounting the connector to the circuit element, if desired.

It is an objective of the present invention to fabricate a connector to have an integral means to maintain the precise spacing and alignment of pluralities of contact arms having contact sections defined thereon and especially when the contact arms are elongate cantilever beams, during shipping and handling prior to eventual soldering of the contact sections to conductive traces of circuit elements.

It is another objective to provide for a simplified process of soldering of the contact sections of a connector to conductive traces of circuit elements, and simplify the tooling necessary to prepare the connector for soldering at the soldering site.

It is yet another objective to provide a connector assembly having integral means to generate thermal energy at only the contact sections thereof to a selected known maximum temperature sufficient to reflow solder to define solder joints to conductive traces of circuit elements, thereby protecting all remaining portions of the connector and the circuit element.

It is an additional objective to provide such a connector with discrete solder preforms for its contact sections.

An embodiment of the present invention will now be described in detail, with reference to the accompanying drawings.

DETAILED DESCRIPTION OF THE PREFERRED EMBODIMENT

Figure 1:
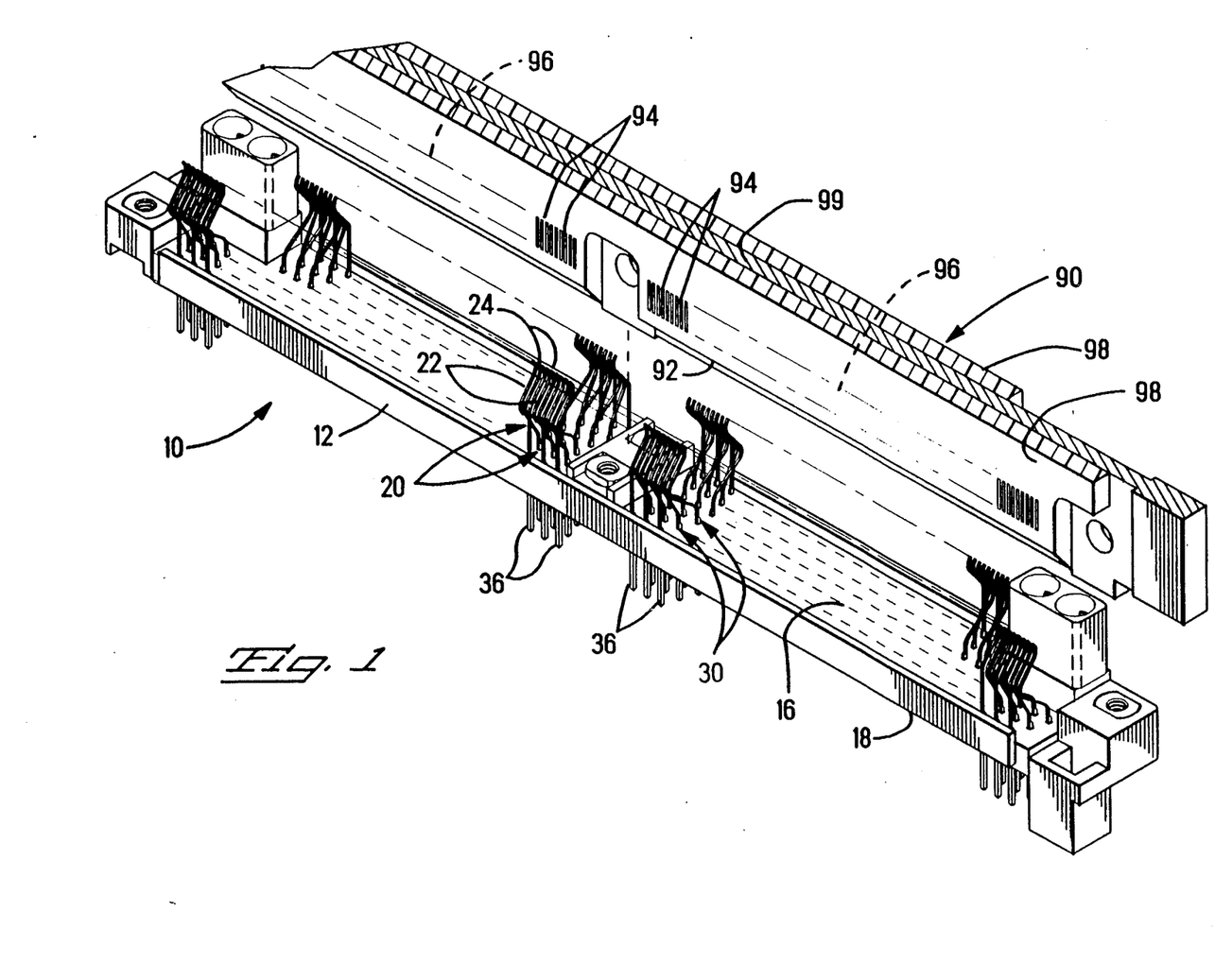
FIG. 1 illustrates a connector of the type with which the present invention is especially useful, having multi-row arrays of contacts extending from a mounting face in opposing pairs to be soldered to a planar circuit element inserted therebetween having conductive traces defined on surfaces thereof.
Figure 2:
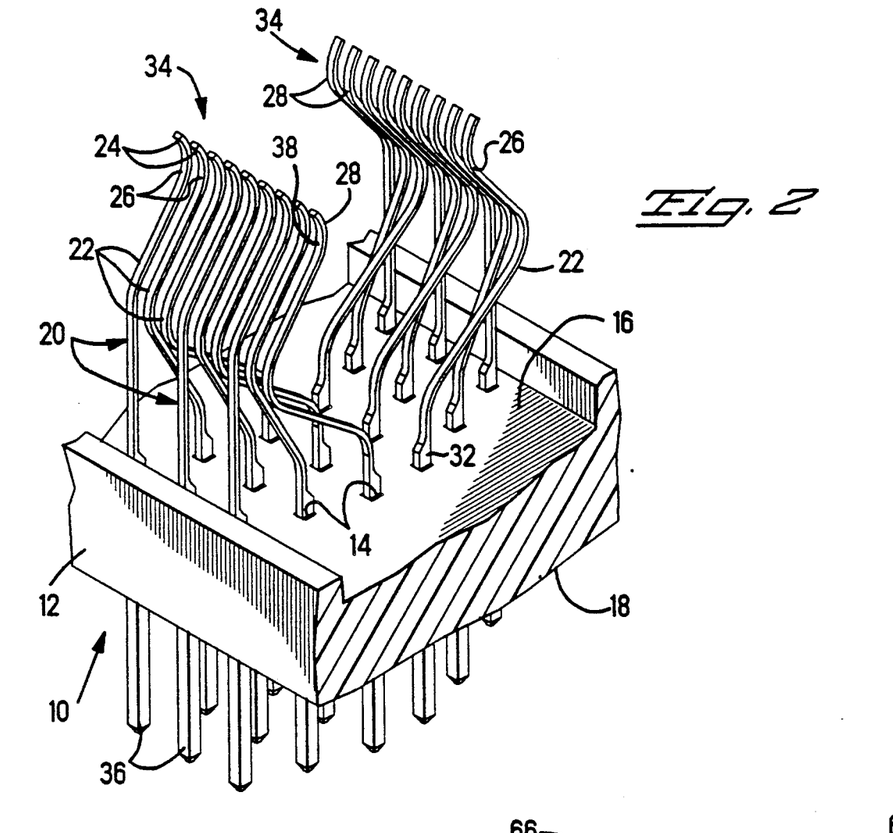
FIG. 2 is an enlarged partial section view of a portion of the connector of FIG. 1 showing opposed arrays of elongate cantilever beam arms of the contacts extending from multiple rows in the housing to single opposed rows of free ends on inwardly facing surfaces of which are the contact sections in common planes to be soldered to the traces.

Connector 10 of FIGS. 1 and 2 is of the type to be mounted to an end 92 of a circuit element 90 to be enclosed within covers (not shown) to define a line replaceable module (LRM) similar to that disclosed in U.S. Pat. Nos. 4,903,402 and 4,925,400. Connector 10 includes a housing 12 of dielectric material such as polyphenylene sulfide having passageways 14 therethrough, with respective contacts 20 secured therein. Elongate cantilever beam arms 22 of contacts 20 extend rearwardly from mounting face 16 of housing 12 to free ends 24. First contact sections 26 proximate free ends 24 are arcuately shaped with trace-proximate surfaces 28 adapted to be soldered to corresponding traces 94 of circuit element 90 proximate end 92 thereof. Although not shown herein, the connector also will generally have an alignment means and keying members secured therein along the mating face; and the connector may optionally include passageways for fiber optic terminals to enable transmission of optical signals to and from the circuit element. Circuit element 90 may be a two sided printed circuit board or, as shown, comprise a composite structure of a central cooling plate 99 on both sides of which are mounted Very High Speed Integrated Circuit (VHSIC) cards 98 near end 92 on which are defined traces 94 arranged in arrays 96; electrical and electronic components and optionally optical devices are then to be mounted on circuit element 90 within the covers of the LRM module which are connected to an electronic apparatus by connector 10 when mated with a mating connector of the apparatus.

Contacts 20 are shown arranged in longitudinal rows 30 along each side of housing 12, with arms 22 extending from body sections 32 disposed within passageways 14; the arms of the contacts in the different rows of each side have slightly differing lengths and formed into different cursive configurations so that free ends 24 of arms 22 of each side are side-by-side and the trace-proximate surfaces 28 are coplanar, defining opposed arrays 34; free ends 24 extend slightly outwardly from opposed arrays 34. Arrays 34 correspond with arrays 96 of conductive traces 94 of circuit element 90, with contact sections 26 precisely spaced to correspond with individual ones of traces 94. Contacts 20 also include second contact sections 36 extending forwardly of mating face 18 of housing 12 for electrical engagement with corresponding contacts matable therewith of a mating connector (not shown).

Second contact sections 36 and body sections 32 may have a square cross-section about 0.017 inches on a side, while arms 22 may have a cross-sectional configuration dimensioned about 0.010 inches along the array and a thickness of about 0.007 inches; elongate cantilever beam arms 22 thus are specifically adapted by shape, dimension and length to be flexible between free ends 24 and body sections 32. When first contact sections 26 are soldered to respective traces 94 of circuit element 90, and connector housing 12 is mounted thereto, connector 10 is incrementally movable with respect to circuit element 90 thus facilitating lateral adjustment of the connector during alignment with a mating connector when the completed module is inserted into the electronic apparatus (such as a black box) along guide channels of the apparatus. Contacts 20 may for example be formed of beryllium copper with nickel underplating and gold plating of second contact sections 6 and tin-lead plating on first contact sections 26.

FIGS. 3 to 8 show a soldering component 40 of the present invention, comprising a block member 42 of thermally insulative material having solder resistive surfaces, and a lead frame 60 of the present invention secured thereto to outer surfaces thereof, with several such components 40 to be used with a connector such as shown in FIGS. 1 and 2. After soldering components 40 are secured by soldering to the respective arrays 34, a connector assembly (FIG. 11) will be defined which will be ready to be soldered to a circuit element 90.

Figures 3, 4:
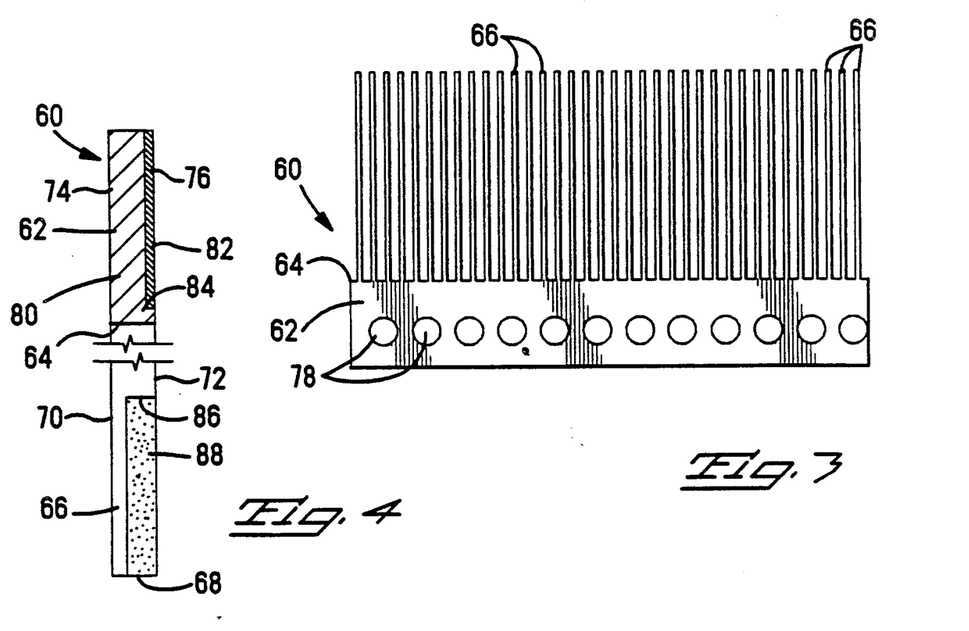
FIGS. 3 and 4 illustrate a lead frame according to the present invention with a plurality of fingers coextending from a body section, the body section having a layer of magnetic material thereon and the fingers having solder preforms thereon, after skiving and stamping from a strip of copper alloy stock and forming of the magnetic material layer and the solder inlays.
Figure 5:
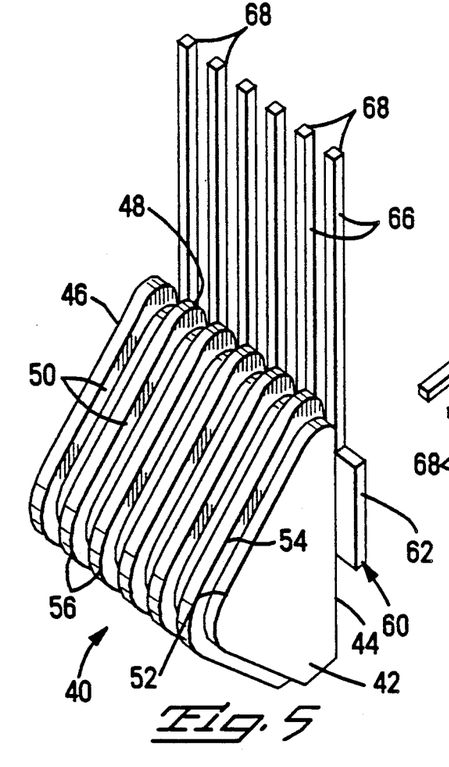
FIGS. 5 to 8 are enlarged partial section perspective views illustrating forming the lead frame about the block member so that the fingers are formed into the grooves and against the outer surface of the block member.
Figure 6:
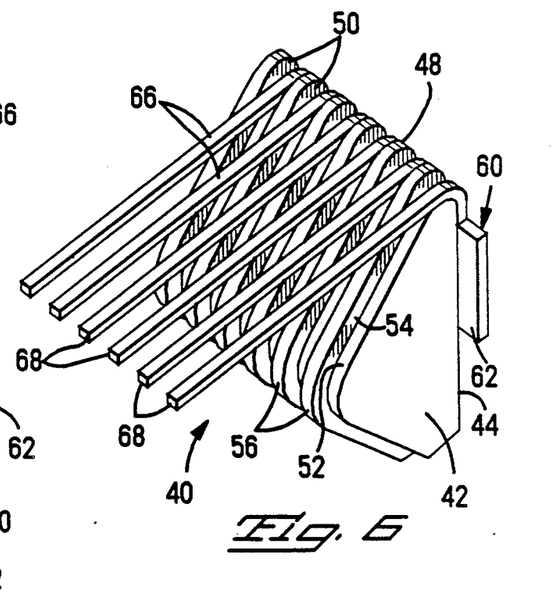
Figure 7:
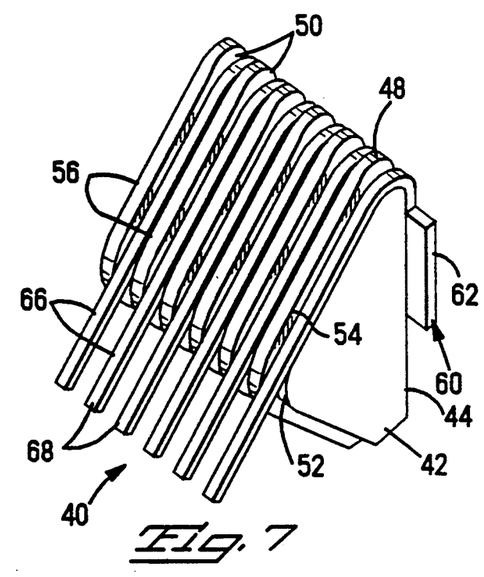
Figure 8:
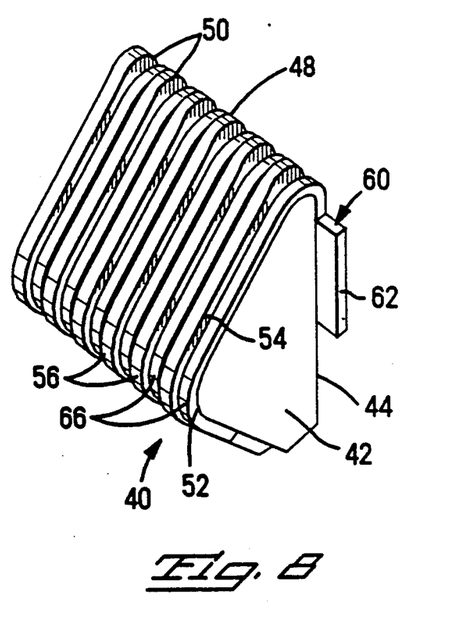

Lead frame 60 is of the type disclosed in U.S. patent application Ser. No. 07/631,819 filed Dec. 21, 1990 (concurrently herewith). Each lead frame 60 includes a body section 62 outwardly from one lateral edge 64 of which coextend a plurality of fingers 66 to free ends 68. Fingers 66 each are associated with and spaced to correspond with a respective first contact section 26 of an array 34 thereof and have a block-proximate side 70 and a contact-proximate side 72 near free ends 68 thereof; fingers 66 are to be soldered to trace-remote surfaces 38 of contact sections 26. Body section 62 can be said to have a block-proximate surface 74 and a block-remote surface 76, and also includes a plurality of regularly spaced registration holes 78.

In FIG. 4 body section 62 and fingers 66 are initially stamped as an integral member from a thin strip of low resistance metal such as a copper alloy, and the copper alloy of body section 62 will be referred to as first layer 80; a second layer 82 of magnetic material is disposed along block-remote surface 76 of first layer 80 of body section 62 in intimate bonded relationship with first layer 80 such as is attainable with known methods of cladding a thin layer of metal to a metal surface. Preferably second layer 82 is incrementally thin and is disposed within a skived recess 84 of body section 62. Each finger 66 is shown to have a reduced thickness by being skived on contact-proximate side 72 to define a solder recess 86 in which solder material is deposited to form an inlay or preform 88, such as by roll cladding or electrodeposition. Skiving preferably is performed before lead frame 60 is stamped from a continuous strip of copper alloy after which the surfaces of at least the fingers should be nickel underplated; also, skiving and stamping may be performed on a strip of double width thus creating a pair of continuous lead frames simultaneously which may subsequently be severed across the still-joined fingers to define ends 68.

In FIGS. 5 to 8 after the magnetic material and the solder preforms are defined on lead frame 60, lead frame 60 is secured to block member 42. The outer surface of block member 42 includes a substantially planar first surface 44 extending along the length thereof to eventually face away from arrays 34 of contact arms 22, and a second surface 46 extending arcuately about the circumference of block member 42 from a radiused bend 48 along the longitudinal edge of first surface 44. Second surface 46 includes an array of grooves 50 extending about the circumference from radiussed bend 48 located to correspond with the spacing of the contact arms 22 of array 34 of connector 10.

Body section 62 is disposed along planar first surface 44 of block 42, and conventional fasteners 58 may be used to be inserted through registration holes 78 of body section 62 and threaded into apertures of block member 42. Elongate fingers 66 are then bent around radiused bend 48 and then carefully wiped (such as by a comb, not shown) into respective grooves 50 spaced to correspond to contact arms 22 of array 34 of connector 10. Grooves 50 have tapered side walls 54 extending outwardly from bottom surface 52 and are wider between ridges 56 than respective contact arms 22 in order that arms 22 are received thereinto, and grooves 50 further have a depth sufficient for fingers 66 with solder preforms 88 therein to be disposed along groove bottoms 52 and additionally for part of the thickness of contact arms 22 to fit therewithin atop solder preforms 88, all as best seen in FIGS. 12A and 12B.

Block member 42 is preferably formed of thermally insulative material which is dimensionally stable under high temperatures, such as for example liquid crystal polymers such as are sold by Celanese Specialties Corporation. Such materials will preferably inherently form the necessary solder resistive surfaces especially at side surfaces 54 and bottom surfaces 52 of grooves 50 proximate solder preforms 88 on fingers 66.

Lead frame 60 may be fabricated from strip stock of a low resistance, low magnetic permeability metal such as brass or Copper Alloy C21000 of beryllium copper and having a thickness of about 0.010 inches before skiving. Second layer 82 is of a metal which has high magnetic permeability and high resistance, the second layer for example being Alloy No. A-42 of nickel (42%) and iron (58%) and having a thickness of 0.0005 inches or between about 1½ to 2 times the thickness of a "skin depth" of the particular metal. Each finger 66 may have a reduced thickness such as about 0.003 inches after skiving. The solder material of preforms 88 may be of Sn 63 having a reflow temperature of about 183° C., and preforms 88 may have a thickness of about 0.007 inches. Contact arms 22 may have a width of about 0.008 inches and fingers 66 may have a width of 0.006 inches where the traces 94 of circuit element 90 may be about 0.012 inches wide while the trace centerline spacing between traces 94 is 0.025 inches, which must also be the centerline spacing of contact sections 26 of contacts 20 of connector 10 and of fingers 66. Were the centerline spacing to be 0.100 inches, contact sections 26 could have a width of 0.030 inches and the fingers slightly less; for a spacing of 0.050 inches, the contacts could have a width of 0.017 inches and the fingers slightly less.

Figures 11, 12A, 12B:
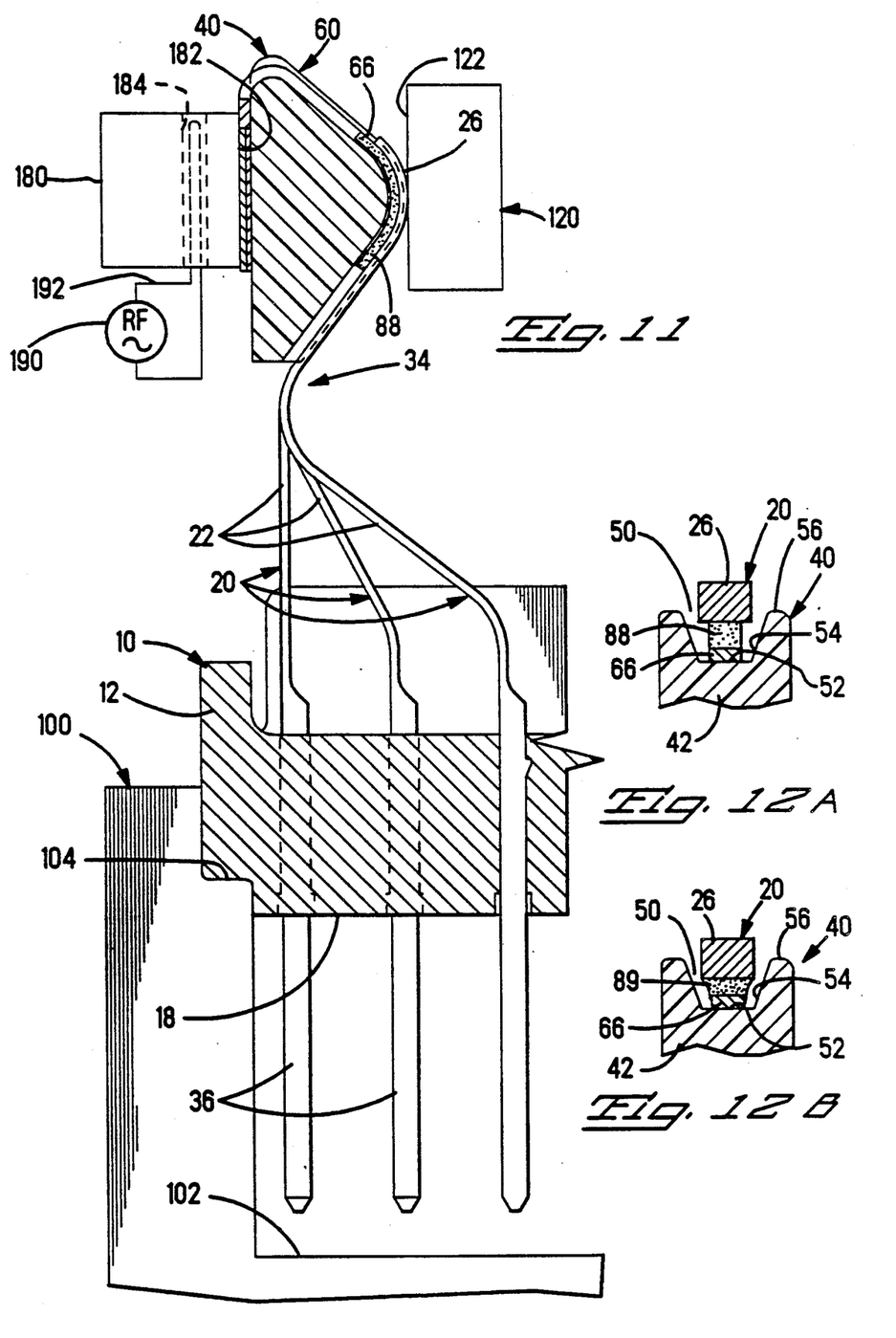
FIG. 11 is a diagrammatic section view illustrating the method of securing the solder component of FIG. 8 to an array of contact arms of the connector of FIG. 1, showing a soldering component positioned against outer surfaces of the contact arm arrays of the connector and in registration therewith, the carrier strip engaged by RF-transmitting tooling to heat and reflow the solder preforms of one array.
FIGS. 12A and 12B are enlarged partial section views of a groove of soldering component showing a lead frame finger with solder thereon and an associated contact section, before and after soldering respectively, to join the component of FIG. 8 to the connector of FIG. 1.

FIG. 11 illustrates connector 10 having soldering components 40 secured along trace-remote surfaces 38 of contact sections 26 of contact arm arrays 34. Second contact sections 36 of contacts 20 extend forwardly from mating face 18 of connector 10 for mating with corresponding socket contacts of a mating connector (not shown). Connector 10 as assembled with soldering components 40 is now ready to be soldered to a circuit element, having integral alignment maintenance and spacing means, integral heater means and integral solder preform means, all defined by lead frames 60 with fingers 66 in grooves 50 and secured to arms 22 of contacts 20. Connector 10 thus can be shipped to a site remote from its manufacturing site in order to be soldered to a circuit element, and is adapted to be resistant to damage to elongate cantilever beam arms during reasonable handling. When connector 10 is fully fabricated, contact sections 26 of opposing arrays 34 are spaced slightly closer together than the thickness of circuit element 90 to be inserted between the arrays when connector 10 is soldered thereto, so that elongate cantilever beam arms 22 apply spring force to contact sections 26 to ultimately generate assured moderate force against traces 94 of circuit element 90 during and after eventual soldering thereto to assist in establishing and maintaining appropriate solder joints therewith.

Figure 9:
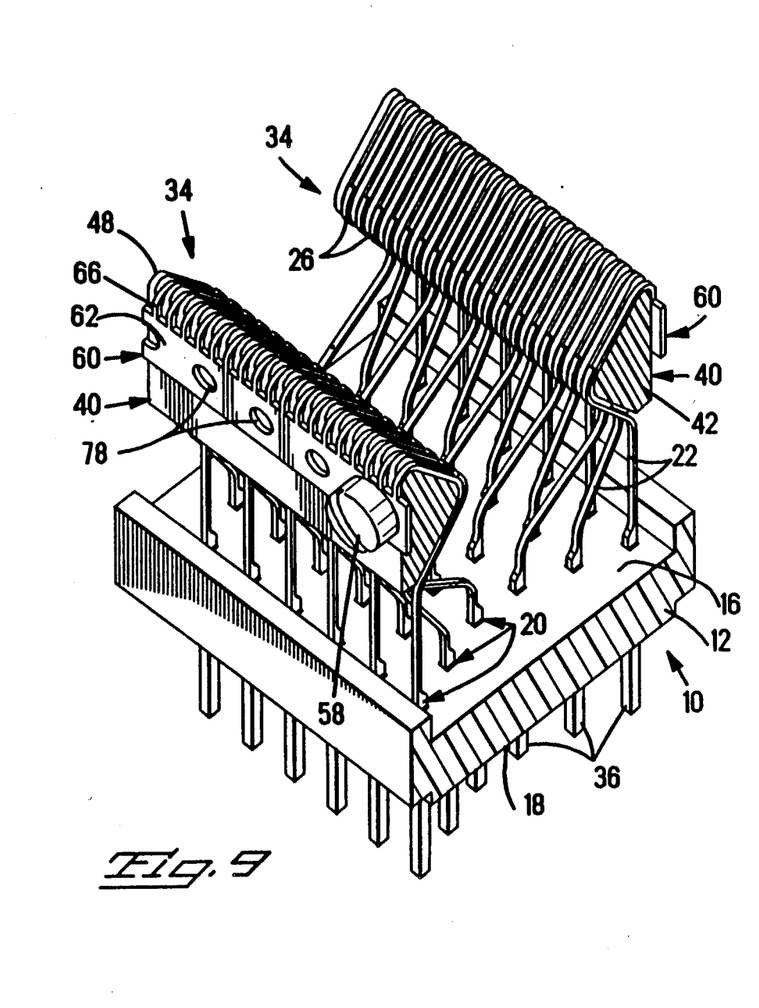
FIGS. 9 and 10 are enlarged partial section perspective views of the connector of FIG. 1 having the soldering components of FIG. 8 soldered thereto, before and after insertion of the planar circuit element inserted between the opposed arrays of contact sections.
Figure 10:
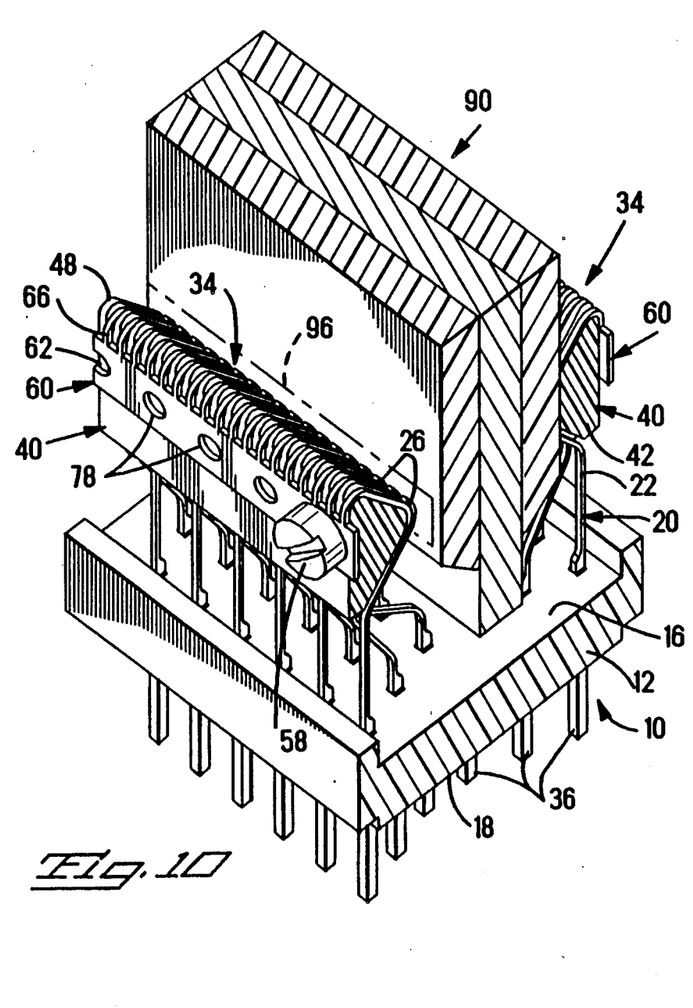

FIG. 9 illustrates connector 10 fully manufactured with soldering components 40 soldered to opposing arrays 34 and ready to be soldered to a circuit element. FIG. 10 illustrates connector 10 after being soldered to circuit element 90 having trace arrays 96. Soldering components 40 may now be carefully manipulated and removed from connector 10 now soldered to circuit element 90.

Figure 13:
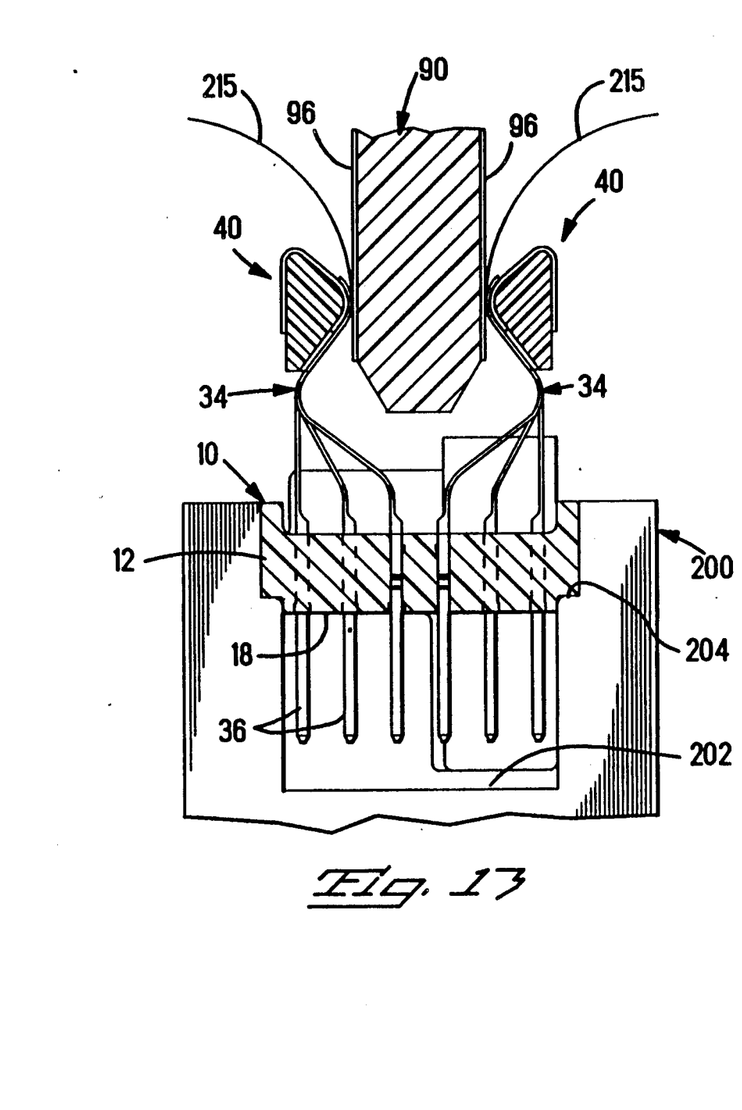
FIGS. 13 to 15 are diagrammatic section views of the connector/soldering component assembly of FIG. 9 being soldered to a planar two-sided circuit element, showing respectively, the assembly positioned in support tooling with the circuit element inserted between the contact section arrays and the traces thereof registered, the soldering component for one of the arrays engaged by RF-transmitting tooling to heat and reflow the solder preforms, and the assembly soldered to both sides of the circuit element and the soldering component being broken away from one side thereof.
Figure 14:
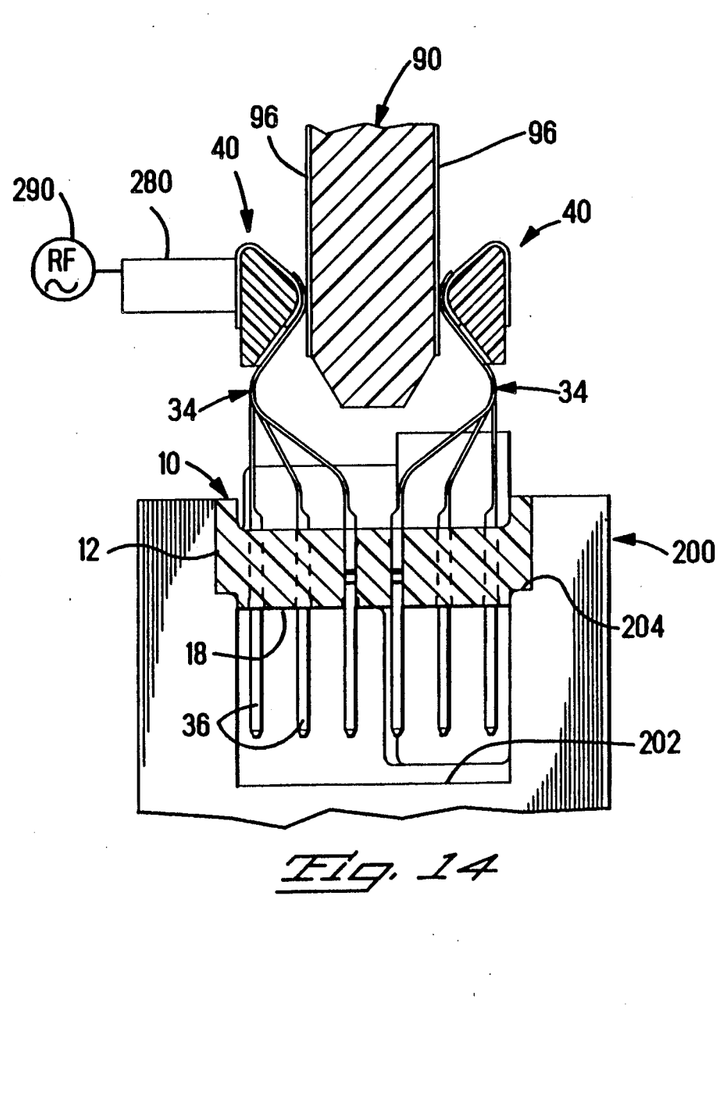
Figure 15:
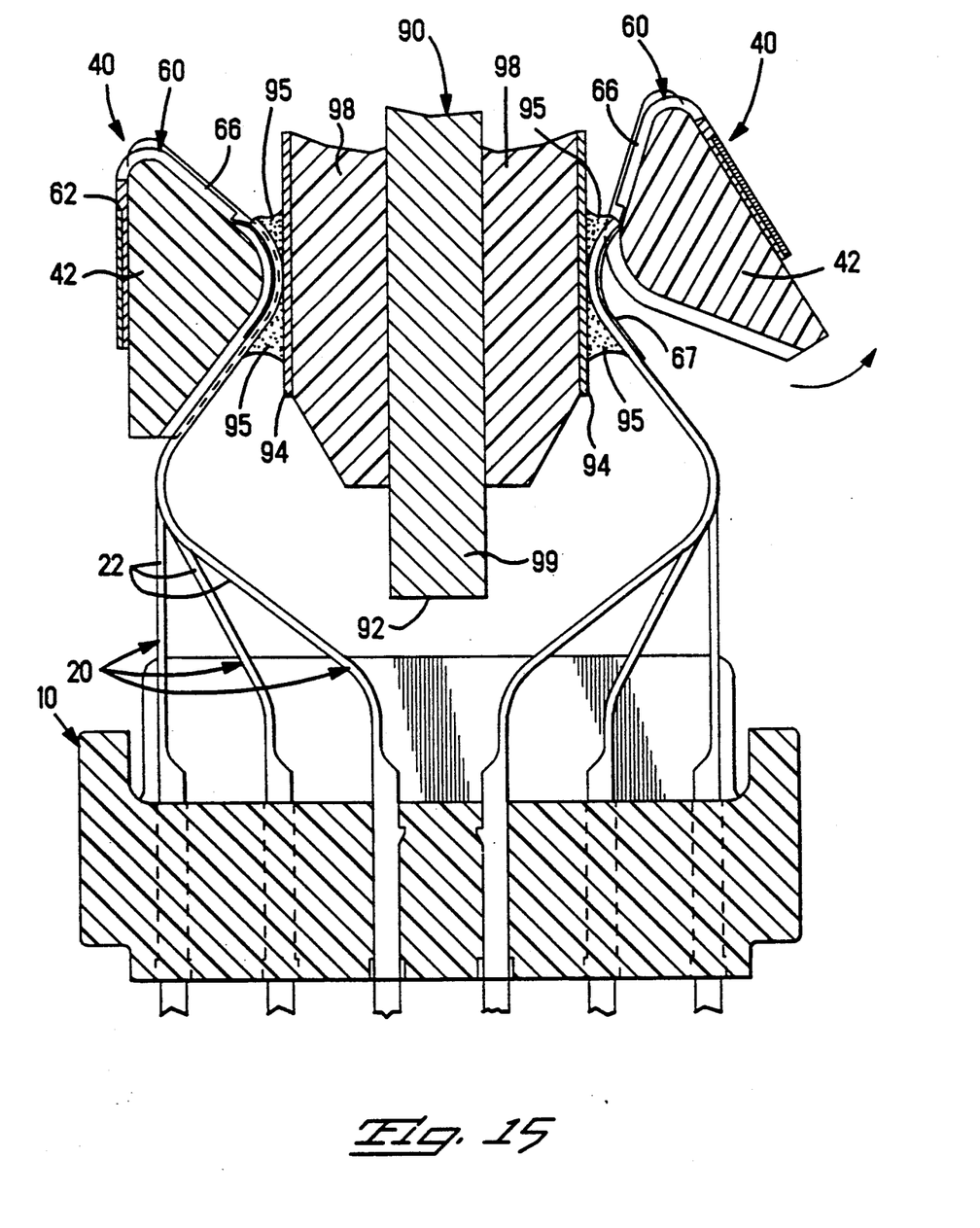

The method of securing soldering components 40 to connector 10 is diagrammatically shown in FIG. 13 which completes its fabrication, and the method of soldering a fully fabricated connector 10 to circuit element 90 is diagrammatically shown in FIGS. 14 to 16.

In FIG. 11, connector 10 is affixed within support tooling 100, nestled within connector-receiving cavity 102. Housing 12 rests on ledges 104 with contact sections 36 and other portions of connector 10 which extend forwardly of mating face 18 depend into the cavity. Contact arms 22 have been received into respective grooves 50 of block member 42 of soldering component 40 by soldering component 40 being moved carefully thereagainst, and contact arms 22 being carefully wiped thereinto and held therewithin by support tooling 120 whose surface 122 may for example be of felt material which will safely engage trace-proximate surfaces of contact sections 26 with slight friction during incremental lateral movement of tooling 120 to finally seat all contact arms in respective grooves 50. Support tooling 120 enables soldering component 40 to apply pressure on contact sections 26 against solder preforms 88 of fingers 66 during soldering. Flux may now be deposited at each solder site such as by brushing the exposed contact arm free ends 24 with liquid flux such as RMA (rosin, mildly activated).

Applicator tooling 180 is then brought firmly against trace-remote surface 76 of body section 62 of lead frame 60, so that surface 182 is in intimate contact with magnetic layer 82; surface 182 may comprise a plurality of projections to minimize draining heat from soldering component 40. Applicator tooling 180 may be made of polytetrafluoroethylene, for example. RF generator 190 may be of the type having a coil 192 disposed within an aperture 184 of applicator tooling 180 proximate surface 182. Applicator tooling 180 may also conveniently be used to apply pressure on soldering components 40 to generate compression against contact sections 26 to facilitate and assure effective soldering.

RF generator 190 generates an alternating high frequency constant amplitude current such as RF current having a frequency of 13.56 mHz, which is transmitted to magnetic layer 82 by applicator tooling 180 for a selected length of time; such an RF generator is disclosed in U.S. Pat. No. 4,626,767. Body section 62 in response generates heat until a temperature is achieved equal to the Curie temperature of the magnetic layer for the given frequency. Such RF current can be applied for a very short period of time such as three to five seconds, to achieve a maximum temperature such as 250° C. to melt solder such as Sn 63 having a reflow temperature of about 183° C., sufficient to define joints for mechanical attachment to contact arms 22.

The thermal energy thus generated in response to the RF current is conducted along fingers 66 to solder preforms 88 which then reflow and form solder joints 89 with contact sections 26, as seen in FIG. 12B. Soldering components 40 may be soldered simultaneously or separately to their associated arrays 34 of contact sections 26. With block member 42 being thermally insulative, little thermal energy is drawn away from lead frame 60. With surfaces of block member 42 being solder resistive, no solder joints are formed joined thereto when solder preforms 88 are heated, and the melted solder does not wet the block surface and flow away from fingers 66 or contact sections 26; the solder of preforms 88 then resolidifies into deposits at joints 89 adjacent contact sections 26 and fingers 66, although some flowing may occur about the side edges of contact arms 22 and of fingers 66. Connector 10 is then cleaned to remove flux.

Connector 10 may now be handled and shipped to another site for assembly to a circuit element; when handled with reasonable care, soldering components 40 secured to arrays 34 of contact arms 22 will maintain the precise original desired spacing and the alignment of elongate cantilever beam arms 22.

In FIG. 13, for being soldered to a circuit element 90, connector 10 is again positioned within a cavity 202 of support tooling 200, similar to tooling 100, on ledges 204 thereof. Connector 10 has been fabricated such that contact sections 26 of the opposing arrays 34 are spaced slightly closer together than the thickness of the circuit element for which connector 10 is intended. Insertion of forward end 92 of circuit element 90 between arrays 34 of contact sections 26 is facilitated by use of thin plastic sheets 215 such as of MYLAR polyester film (trademark of E. I. duPont de Nemours and Company). Incremental lateral movement of circuit element 90 then adjusts the position thereof to precisely register the alignment of the traces thereon with respective contact sections 26, facilitated by thin plastic sheets 215 which prevent snagging of side edges of the fingers of the lead frames 60 or disturbance of the solder preforms with the traces which may protrude incrementally above the surface of circuit element 90.

Although certain tooling or fixtures is preferably to be utilized in holding and positioning the connector and the circuit element relative to each other, such tooling need not comprise a comb needing to be interdigitated with contact arms 22 to attain realignment and respacing thereof to correspond with the traces of the circuit element array. The contact arm arrays of the connector are incrementally movable as integral units to attain precise registration with the circuit element traces, and then the thin plastic sheets 215 are carefully removed by being withdrawn vertically, after which trace-proximate surfaces 28 of contact arms 22 will be in engagement with traces 94 of arrays 96 (FIGS. 1 and 10) of the circuit element; traces 94 will conventionally be plated with a coating of tin-lead alloy for enhancement of solder joint formation.

Soldering of connector 10 to circuit element 90 is shown in FIG. 14. Applicator tooling 280 and RF generator 290 may be similar to applicator tooling 180 and RF generator 190 of FIG. 11, and as with attachment of soldering component 40 to connector 10, may be applied to both components along both arrays to solder both sides of circuit element 90 simultaneously, if desired. Applicator tooling 280 is pressed firmly against the trace-remote surface of the body section of lead frame 60 in intimate engagement with the magnetic layer therealong. Flux such as RMA is again preferably added to the solder sites. RF current is generated by RF apparatus 290 and transmitted to the body section of lead frame 60; thermal energy is generated until the known maximum temperature is reached and maintained, and is conducted along fingers 66 to resolidified solder preforms 88. RF current such as 13.56 mHz is preferred, for a short period of time such as three to seven seconds, to achieve a maximum temperature such as 250° C. to melt solder such as Sn 63 having a reflow temperature of about 183° C.

The solder of deposits at joints 89 (FIG. 12B) again reflows to flow or wick about side edges of contact arm free ends 24 together with now-molten tin-lead plating on traces 94 to form solder joints 95 with the traces of the circuit element 90, as seen in FIG. 15. After soldering has been performed, block member 42 may now be removed by being pivoted back and forth about the free ends of the contact arms 22 two or three times for example, weakening the metal of thin fingers 66 adjacent the ends of the contact arm free ends until fracture occurs, after which block member 42 with body section 62 is removed leaving innocuous small remnants 67 of fingers 66 soldered to the trace-remote surfaces 38 of contact sections 26 of connector contacts 20.

Solder joints 95 define desired fillets in the areas between the arcuate surfaces and adjacent flat surfaces, or at end edges and side edges of the contact sections, the fingers and the traces, to establish assured electrical connections between the contacts 20 of connector 10 and traces 94 of circuit element 90. Connector 10 after soldering to circuit element 90 is again cleaned of flux. Additional mechanical securement may be utilized to assuredly secure connector housing 12 to circuit element 90 such as with conventional fastener members as disclosed in U.S. Pat. No. 4,903,402 and cover members secured therearound to define a line replaceable module, for example.

As shown in FIG. 15, soldering components 40 may now be carefully manipulated and removed from connector 10 now soldered to circuit element 90. Block member 42 may now be pivoted back and forth about the end of free ends 28 of contact arms 22, which are now soldered at joints 95 to respective traces 94, which process breaks thin fingers 66 at locations spaced from solder joints 95. Remnants 67 of fingers 66 remain soldered along trace-remote sides of contact sections 26 of connector contacts 20 and are now innocuous.

Since the thermal energy generated by lead frame body sections 62 is transmitted only to the discrete solder sites, and only to a known carefully selected maximum temperature, and only for a very brief time period, the remainders of both connector 10 and circuit element 90 are generally protected from substantial amounts of thermal energy, and circuit element 90 is now able to be loaded, prior to securing the connector thereon, with electrical and electronic components whose solder joints to the element will not be affected by high temperatures. Also, optical devices such as light emitting and light detecting devices may be previously mounted thereon along with fiber optic cables having terminals on ends thereon to be inserted into corresponding passageways of connector 10 for transmission of optical signals to and from the circuit element.

Soldering components 40 assist not only the maintenance of spacing and alignment of elongate contact arms 22 but also the delivery of defined solder portions 88 to specific sites, and are useful in yet another valuable way: to enable the generation of thermal energy at only the solder sites, which isolates the remainder of the circuit element and the connector from the degrading effects of high temperature and greatly simplifies the soldering process, in addition to the presoldering handling and eliminates the need for expensive and elaborate conventional tooling of the special type previously required therefor to realign and precisely respace the contact arm free ends.

There may occur various modifications to the method disclosed hereinabove and to the soldering component of the present invention which will be within the spirit of the invention and the scope of the claims.

What is claimed is:

1. A method of preparing an electrical connector to be soldered to a circuit element, the connector of the type having at least one array of contact arms extending from a mounting face to free ends defining contact sections disposed in a common plane for being soldered to a corresponding array of conductive means defined on a common surface of the circuit element to establish a plurality of electrical and mechanical connections between the connector and the circuit element, comprising the steps of:

providing a source for generating a constant amplitude high frequency alternating current of known frequency;

forming a lead frame corresponding to each said array of contact arms of said connector, each said lead frame having a carrier strip section and a plurality of fingers coextending from said carrier strip section each associated with and spaced to correspond with respective ones of said free ends of said elongate contact arms of said array, said lead frame being of a first metal having low electrical resistance and minimal magnetic permeability;

defining along said carrier strip section on a major surface thereof a second layer of a second metal having high electrical resistance and high magnetic permeability, said second layer having a thickness at least equal to one skin depth of said second metal, given said known frequency, said first metal of said carrier strip section being a first layer to which said second layer is intimately joined and said carrier strip section thereby defining a heater means integral to said lead frame;

disposing solder material containing flux therein on each said finger on a major surface thereof at least proximate the free end thereof, defining solder preforms, said solder material having a nominal reflow temperature slightly less than the Curie temperature of said second metal;

forming an elongate block member of thermally insulative material having a solder resistive outer surface, said outer surface having a first portion and a second portion, said first portion being substantially planar and extending along said block member, and said second portion being smoothly arcuate and adjoining said first portion along a lateral edge thereof, an array of grooves corresponding to said array of contact arms being defined in said second portion extending transversely from said first portion and across said second portion;

securing said lead frame on said outer surface of said block member with said carrier strip section being secured to and along said first surface portion, and said fingers being disposed along bottom surfaces of respective said grooves, defining a soldering component;

positioning said soldering component adjacent traceremote surfaces of free ends of a respective said contact arm array such that said contact arm free ends are received into respective said grooves and said end portions of said fingers are registered with and against respective ones of said contact sections, and such that said carrier strip section faces away from said contact arm array;

generating said constant amplitude high frequency alternating current in said carrier strip section for a selected length of time, thereby generating thermal energy transmitted along said fingers to said solder material and reflowing said solder material which will form solder joints between said fingers and said free ends of said contact arms thus securing said soldering component to said array, whereby a connector is defined having an integral means to maintain the precise alignment and spacing of said coplanar free ends of said contact arms prior to soldering to a said circuit element, and further having an integral heater means and integral amounts of solder material at said free ends of said contact arms, all facilitating eventual soldering of said contact arms to respective said conductive means of a said circuit element whereafter said lead frame carrier strip section is removable to define discrete isolated circuits.

2. The method as set forth in claim 1 wherein said second layer is disposed to face outwardly from said outer surface of said block member to facilitate engagement by RF current applicator means during said soldering.

3. The method as set forth in claim 1 wherein said grooves of said block member have angled side walls to have widened entrances therealong, whereby said grooves are adapted to receive thereinto respective ones of said contact arm free ends upon positioning said soldering component adjacent said contact arm array.

4. A method of securing an electrical connector to a circuit element, the connector of the type having at least one array of contact arms extending from a mounting face to free ends defining contact sections disposed in a common plane for being soldered to a corresponding array of conductive means defined on a common surface of the circuit element to establish a plurality of electrical and mechanical connections between the connector and the circuit element, comprising the steps of:

providing a source for generating a constant amplitude high frequency alternating current of known frequency;

securing to said contact arm free ends of said connector a soldering component including a block member of thermally insulative material having a solder resistive outer surface, and further including secured to said outer surface of said block member a lead frame having a plurality of fingers each in registration with and joined to a respective said contact arm free end and having respective amounts of solder material secured thereto at least proximate trace-remote surfaces of said contact arm free ends, said lead frame further including a body section defining an integral Curie point heater means adapted to generate thermal energy until achieving a known maximum selected temperature when subjected to said current of known frequency for a selected length of time, and said soldering component adapted to integrally maintain the spacing of said contact arm free ends after said joining;

placing said circuit element adjacent said trace-proximate surfaces of said contact arm free ends with said conductive means in registration therewith;

generating said constant amplitude high frequency alternating current in said heater means for said selected length of time; and     removing said block member and at least said body section from said contact arms, thereby defining discrete electrical circuits,     whereby thermal energy is generated by said carrier strip section and conducted to said contact arm free ends by said fingers and reflowing said solder amounts thereat and forming assured joints between said contact arm free ends and respective said conductive means of said circuit element, enabling said connector to be soldered to said circuit element without individually realigning and respacing said contact arm free ends in registration with said circuit element conductive means prior to soldering requiring tooling which must be especially adapted therefor, or for placing solder amounts at said joint sites or for subjecting the entire circuit element and connector to high temperatures necessary to otherwise reflow the solder material.

5. The method of claim 4 wherein said step of removing said soldering component from said contact arm free ends comprises manipulating said block member to pivot about ends of said contact arm free ends to weaken and break said fingers of said lead frame thereat.

6. A soldering component for use in facilitating the soldering of an array of free ends of contact arms of an electrical connector to a corresponding array of conductive means of a circuit element, usable in conjunction with a source of constant amplitude high frequency alternating current of known frequency and a lead frame having an elongate body section and transversely extending therefrom a plurality of fingers each in registration with and joined to a respective said contact arm free end and having respective amounts of solder material secured thereto at least proximate trace-remote surfaces of said contact arm free ends, the body section defining an integral Curie point heater means adapted to generate thermal energy until achieving a known maximum selected temperature when subjected to said current of known frequency for a selected length of time, said soldering component comprising:

an elongate block member of thermally insulative material having a solder resistive outer surface, said outer surface having a first portion and a second portion, said first portion being substantially planar and extending along said block, and said second portion being circumferentially arcuate and adjoining said first portion along a lateral edge thereof, an array of grooves corresponding to said array of contact arms being defined in said second portion extending transversely from said edge of said first portion and across said second portion;

said lead frame being secured to said outer surface of said block member with said body section being secured to and along said first surface portion, and said fingers being elongate and being formed to be disposed along bottom surfaces of respective said grooves;

whereby a soldering component is defined securable to said contact arm free ends enabling said connector to be soldered to said circuit element without individually realigning and respacing said contact arm free ends in registration with said circuit element conductive means prior to soldering requiring tooling which must be especially adapted therefor, or for placing solder amounts at said joint sites or for subjecting the entire circuit element and connector to high temperatures necessary to otherwise reflow the solder material.

7. The soldering component as set forth in claim 6 wherein an array of precisely spaced and dimensioned holes are stamped into and along said body section defining means to secure said lead frame to said block member.

8. The soldering component as set forth in claim 6 wherein said body section of said lead frame includes a layer of magnetic material disposed to face outwardly from said outer surface of said block member to facilitate engagement by RF current applicator means during said soldering.

9. The soldering component as set forth in claim 6 wherein said grooves of said block member have angled side walls to have widened entrances therealong, whereby said grooves are adapted to receive thereinto respective ones of said contact arm free ends upon positioning said soldering component adjacent said contact arm array.

* * * * *